(12) United States Patent
Itabashi et al.

(10) Patent No.: US 6,900,394 B1
(45) Date of Patent: May 31, 2005

(54) ELECTROLESS COPPER PLATING MACHINE, AND MULTI-LAYER PRINTED WIRING BOARD

(75) Inventors: Takeyuki Itabashi, Hitachi (JP); Haruo Akahoshi, Hitachi (JP); Tadashi Iida, Atsugi (JP); Yoshinori Ueda, Hadano (JP); Eiji Takai, Yokohama (JP); Naoki Nishimura, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 423 days.

(21) Appl. No.: 09/678,800

(22) Filed: Oct. 4, 2000

(30) Foreign Application Priority Data

Oct. 6, 1999 (JP) ............................................ 11-285322

(51) Int. Cl.[7] .......................... H01R 12/04; H05K 1/11
(52) U.S. Cl. ...................................... 174/262; 174/260
(58) Field of Search ................................ 174/260–262; 118/429; 427/98, 305, 345, 437; 205/702, 770–772

(56) References Cited

FOREIGN PATENT DOCUMENTS

JP    57192252    11/1982

*Primary Examiner*—Randy W. Gibson
*Assistant Examiner*—Tuan Dinh
(74) *Attorney, Agent, or Firm*—Antonelli, Terry, Stout & Kraus, LLP (57) ABSTRACT

A method is provided for removing plating blocking ions, such as anions, in pairs with copper ions and oxidant ions of a copper ion reducing agent from an electroless copper plating solution and keeping a constant salt concentration in the electroless copper plating solution during plating. The electroless copper plating method uses a plating solution containing copper sulfate as copper ion sources, and a copper ion complexing agent as copper ion sources, glyoxylic acid as a copper ion reducing agent, and a pH conditioner. The method is characterized by precipitating and removing sulfuric and oxalic ions in said electroless copper plating solution and keeping an optimum concentration of at least one of sulfuric and oxalic ions in said electroless copper plating solution during plating.

4 Claims, 5 Drawing Sheets

ELECTROLESS COPPER PLATING MACHINE, AND MULTI-LAYER PRINTED WIRING BOARD

BACKGROUND OF THE INVENTION

The present invention relates to an electroless copper plating method of reducing the concentration of byproduct ions and deposition of byproducts in a plating solution, a device thereof, and an application thereof.

The usual electroless copper plating solution contains copper ions, a copper ion complex agent, a copper ion reducing agent, and a pH conditioner, which must be supplied as the plating advances. However, this supply increases anions in pairs with copper ions, oxidant ions of the copper ion reducing agent, and cations of the pH conditioner in the plating solution.

These ions increasing in the plating solution will deteriorate the physical properties of the plated layer, particularly the elongation ratio of the plated layer, reducing the reliability of the plated layer. Further, it reduces the stability of the plating solution and causes abnormal deposition and autolysis.

Conventionally, to avoid such problems and to maintain a constant salt concentration in the plating solution, various plating techniques have been used, such as changing plating solutions at short-time intervals, and continuously adding a new plating liquid to the plating solution in use. However, these approaches require a large quantity of expensive copper plating solution and a lot of labor and money to dispose of liquid wastes.

Japanese Non-examined Patent Publication No. 56-136967 (1981) has disclosed a method of continuously removing such cumulative ions by an electro dialysis. This method requires complicated operations to maintain the optimum pH for dialysis. Further, the ion selecting membrane which allows plating blocking ions only to penetrate the membrane is mechanically weak, difficult to maintain, and too expensive.

Japanese Non-examined Patent Publication No. 7-268638 (1995) has disclosed a plating method characterized by selecting the metallic ion reducing agent and the pH conditioner in the non-electro plating solution so that the oxidant ion of the metallic ion reducing agent and the cation of the pH conditioner may react into an insoluble salt to prevent oxidant ions of said metallic ion reducing agent from increasing in said plating solution.

However, this method is not effective to prevent an increase of anions in pairs with metallic ions. The increase of the anions will deteriorate the plating characteristics. This method also suggests that the use of copper oxide or copper hydroxide in copper plating will suppress characteristic deterioration of the plating solution. In this case, however, the solubility of the copper oxide or copper hydroxide has a great influence.

Solid copper oxide or copper hydroxide is usually added to the plating solution. If the solid is not dissolved completely into the plating solution, the particles left undissolved are plated as the cores. This causes abnormal deposition or autolysis. Further, copper oxide and copper hydroxide are more expensive than copper sulfate as copper ion sources, which is conventionally used for copper plating. That's the reason why copper oxide and copper hydroxide have not been put in practical use.

Japanese Non-examined Patent Publication No. 7-286279 (1995) has disclosed a method of adding barium hydroxide to the non-electro plating solution and removing excessive sulfuric ions as barium sulfate from the plating solution. However, this method using formalin (35% aqueous formaldehyde solution) cannot avoid a consequent increase of oxidant ions of the copper ion reducing agent in the copper plating solution. The oxidant ions of the copper ion reducing agent in this method are formic ions and cannot be removed because barium formate has too great a solubility to be precipitated.

Further, this method does not blow air into the solution while adding barium hydroxide into the plating solution. When alkaline barium hydroxide is added to the plating solution, the pH value of the plating solution becomes higher. In electroless copper plating, the plating solution becomes unstable when its pH goes too high. Consequently, copper may deposit on unwanted places. This abnormal deposition on printed circuits and the like may cause short-circuits, reducing the yield of the products. Deposition on the walls of the plating bath may drastically deteriorate the workability.

The conventional plating equipment is usually designed to directly add copper ions, the copper-ion reducing agent, and the pH conditioner into the plating bath. However, this equipment cannot be free from the floating of solid particles of insoluble salt in the plating solution. The floating solid particles when deposited on wiring boards may cause abnormal deposition on the boards.

If such a solid particle is caught in a through-hole on a printed wiring board, it prevents part of the through-hole from being plated, causing a discontinuity of the wiring (which is termed "through-hole void").

In continuous electroless copper plating, byproduct ions such as anions in pairs with copper ions and oxidant ions of the copper ion reducing agent increase in the plating solution. This increasing of the byproduct ions prevent the electroless copper plating reaction from forming normal plating layers and reduces the quality of the plated layer. This not only reduces the mechanical properties of the plated layer, but also causes abnormal deposition of metal on unwanted locations. Up to now, there have been disclosed no effective electroless copper plating method of preventing the increase of plating blocking ions or removing the increased plating blocking ions and refreshing the plating solution.

SUMMARY OF THE INVENTION

The main purpose of the present invention is to provide a method of removing plating blocking ions such as anions in pairs with copper ions and oxidant ions of the copper ion reducing agent from the electroless copper plating solution and keeping a constant salt concentration in the electroless copper plating solution during plating, a device to realize said method, and applications thereof.

A summary of the present invention is as follows:

[1] An electroless copper plating method using a plating solution containing copper sulfate as copper ion sources, and a copper ion complex agent, a copper ion reducing agent or glyoxylic acid as a copper ion reducing agent, and pH conditioner, wherein said method comprises steps of using the hydroxide of an alkaline earth metal as said pH conditioner to react with sulfuric ions in the electroless copper plating solution into a salt of said alkaline earth metal, removing the precipitate from the plating solution, measuring at least one of the concentration of sulfuric ion in the plating solution (when the copper ion reducing agent is used) and the concentration of oxalic ion in the plating solution (when glyoxylic acid is used) and keeping an optimum sulfuric ion or oxalic ion concentration or preferentially 0.1 mol per liter or less of sulfuric ion and 0.2 mol per liter or less of oxalic ion during plating.

[2] An electroless copper plating method using a plating solution containing copper sulfate as copper ion sources, and copper ion complex agent, a copper ion reducing agent or glyoxylic acid as the copper ion reducing agent, and pH conditioner, wherein said method comprises steps of adding at least one of alkaline earth metal, alkaline earth metal oxide, alkaline earth metal hydroxide, and alkaline earth metal salt (excluding sulfuric salt) to the plating solution to react with sulfuric ions in the electroless copper plating solution into a salt of said alkaline earth metal, removing the precipitate from the plating solution, measuring at least one of the concentration of sulfuric ion in the plating solution (when the copper ion reducing agent is used) and the concentration of oxalic ion in the plating solution (when glyoxylic acid is used) and keeping an optimum sulfuric ion or oxalic ion concentration or preferentially 0.1 mol per liter or less of sulfuric ion and 0.2 mol per liter or less of oxalic ion during plating.

[3] An electroless copper plating machine using a plating solution containing copper sulfate as copper ion sources, and copper ion complex, a copper ion reducing agent or glyoxylic acid as a copper ion reducing agent, and pH conditioner, wherein said device comprises an electroless copper plating bath, a reaction bath which adds at least one of alkaline earth metal, alkaline earth metal hydroxide, alkaline earth metal oxide, and alkaline earth metal salt (excluding sulfuric salt) to said copper plating solution therein to react with and precipitate sulfuric ions or oxalic ion (when glyoxylic acid is used) as an alkaline earth metal salt in said plating solution, a filter unit which separates said metallic salt precipitate, means for measuring at least one of the concentration of sulfuric ion (when the copper ion reducing agent is used) and the concentration of oxalic ion in the plating solution (when glyoxylic acid is used), and means for comparing at least one of said measured concentrations by a preset reference concentration and controlling the quantity of said alkaline earth metal, alkaline earth metal hydroxide, alkaline earth metal oxide, or alkaline earth metal salt (excluding sulfuric salt) to be added.

[4] An electroless copper plating machine using a plating solution containing metallic ions, an agent for reducing said metallic ions, and a pH conditioner, wherein said machine comprises An electroless copper plating bath, a reaction bath adding at least a metal or a compound containing a metal to said plating solution to precipitate ions which suppress generation of said plating metal, and a ultrafiltration unit.

[5] Said filtration unit is preferably a cross-flow type ultrafiltration unit or a filter press type ultrafiltration unit.

[6] A multi-layer wiring board having insulating layers and circuit layers accumulated and cemented alternately wherein the circuit layers are electrically connected by copper-plated through-holes which pass through the insulating layer between said circuit layers or by copper-plated via-holes whose one end is closed and wherein the copper plating of said multi-layer wiring board is made by said electroless copper plating method.

[7] A module having one or more semiconductor elements on said multi-layer wiring board.

The method of the present invention removes said insoluble salt by saturating it at a temperature lower than the plating temperature to cause it to precipitate and then removing the precipitate. A method of concentrating the plating solution can also be used to cause the insoluble salt to precipitate.

Removal of said insoluble salt can be done by circulating the plating solution while plating is in progress or in a batch manner when plating is not in progress after sulfuric ions and oxidant ions of the copper ion reducing agent in the non-electro plating solution exceed the preset quantities.

Below will be briefly explained a copper plating using copper sulfate as copper ion sources, as a copper ion source and glyoxylic acid as the copper ion reducing agent.

When copper sulfate, as copper ion sources, is used as a copper ion source, the sulfuric ions increase in the plating solution. When glyoxylic acid is used as a copper ion reducing agent, the glyoxylic acid behaves as glyoxalate ions in the plating solution and is reacted into oxalic ions which are the oxidant ions. This reaction is (Reaction formula 1)

When the concentration of the byproduct ions exceeds a limit (0.1 mol per liter of sulfuric ions or 0.2 mol per liter of oxalic ions), the plating solution will lose its characteristics quickly. Experimentally, the concentration of the byproduct ions exceeds the limit when a plating layer of 30 to 60 $\mu$m thick is formed under conditions of a plating bath load of 1 $dm^2$ per liter.

When calcium hydroxide is added as a pH conditioner, the sulfuric ions in the plating solution are precipitated as calcium sulfate and the concentration of remaining sulfuric ions will become very low (about 0.01 mol per liter or less), same the solubility of calcium sulfate is about 0.15 gram solute per 100 grams water at 60° C.

Similarly, the oxalic ions in the plating solution are precipitated as calcium oxalate and the concentration of remaining oxalic ions will become extremely low (about $7 \times 10^{-6}$ mol per liter or less), since the solubility of calcium oxalate is about 0.001 gram solute per 100 grams water at 60° C. When the plating solution contains sulfuric ions of 0.01 mol per liter or less and the oxalic ions of $7 \times 10^{-6}$ mol per liter or less, the plating characteristic is excellent and the plated layer is very ductile.

Under this condition, no abnormal copper deposition is found on non-plating locations and the plating solution is also very stable. To add calcium ions into the plating solution, use a calcium pH conditioner, calcium powder, calcium acetate, calcium carbonate, calcium chloride, calcium oxide, and the like.

A similar result can be obtained when calcium is replaced by barium. When one of the above barium compounds is used, almost all sulfuric ions in the plating solution are precipitated as barium sulfate and the concentration of remaining sulfuric ions will become very low (about $1.5 \times 10^{-4}$ mol per liter or less), since the solubility of barium sulfate is about 0.0036 gram solute per 100 grams water at 50° C.

Similarly, the oxalic ions in the plating solution are precipitated as barium oxalate and the concentration of remaining oxalic ions will become extremely low (about $7.9 \times 10^{-5}$ mol per liter or less), since the solubility of barium oxalate is about 0.00175 gram solute per 100 grams water at 60° C.

Air must be blown into the plating solution while said compounds are added into the plating solution to remove the precipitate of sulfuric and oxalic ions. For addition of a substance which shows alkalinity in an aqueous solution and increases the pH value of the plating solution such as calcium hydroxide, barium hydroxide, calcium powder, barium powder, and the like, blowing air into the solution is always required while the substance is added to the plating solution.

Figure 1:
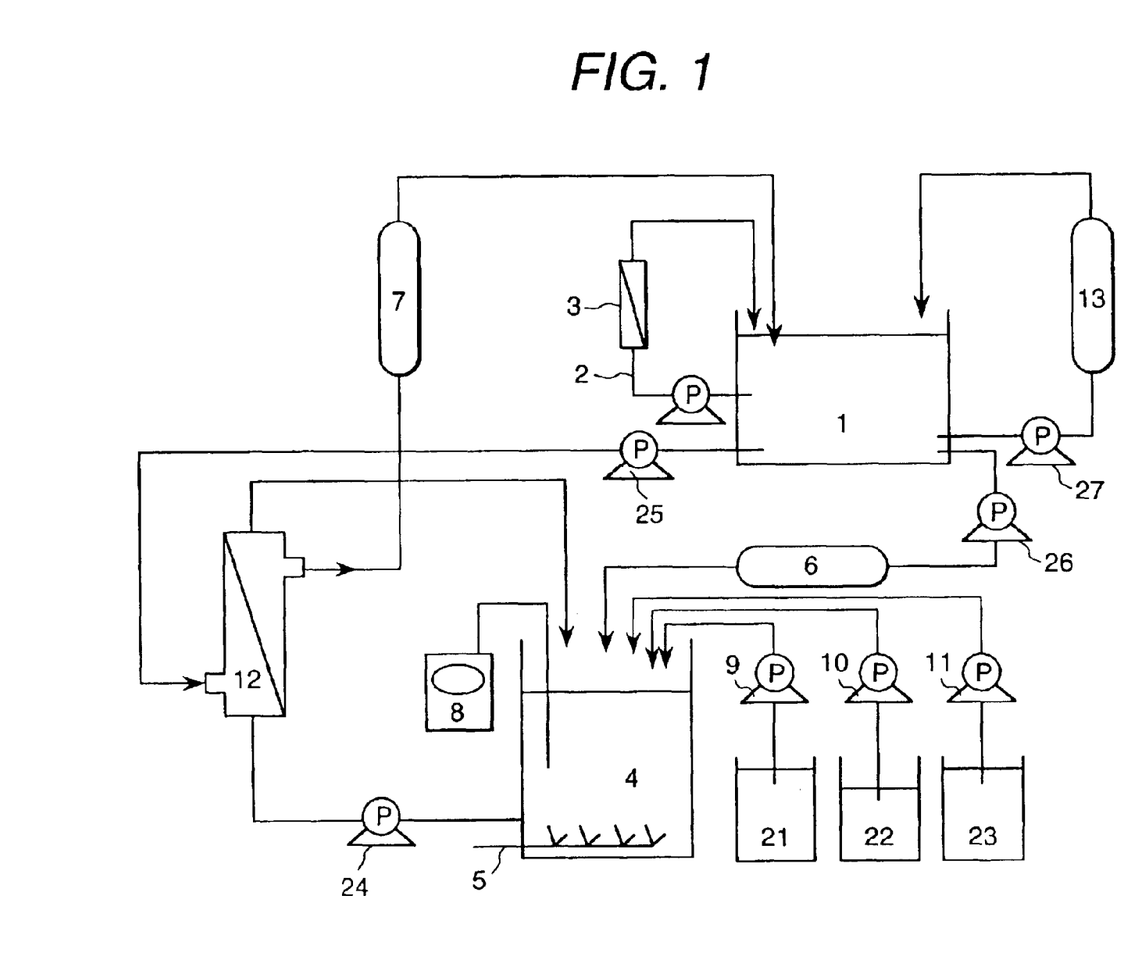
FIG. 1 is a diagram illustrating the configuration of a plating machine in accordance with the present invention.

A plating method and a plating machine in accordance with the present invention do not limit the choice of a complexing agent for the electroless copper plating solution (hereinafter abbreviated as a copper plating solution). In other words, it can be any as far as it can form a stable complex with copper ions such as
ethylenediaminetetraacetic acid (EDTA),
Rochelle salt, nitrilotriacetic acid (NTA),
nitrilotripropionic acid (NTP),
ethylenediaminediacetic acid (EDDA),
ethylenediaminepropionicdihydrochloride (EDDP),
iminodiacetic acid (IDA),
trans-1.2-diaminocyclohexane-N,N,N'N'-tetraacetic acid (CyDTA),
diaminopropanoltetraacetic acid (DPTA-OH),
ethylenediaminediacetic acid (EDDA),
triethylenetetraaminehexaacetic acid (TTHA),
diethylenetriamine-N,N,N',N'',N'''-pentaacetic acid (DTPA),
dihydroxyethyl glycine (DHEG),
hydroxyethylenediaminetriacetic acid (EDTA-OH),
glycoletherdiaminetetraacetic acid (GEDTA),
nitrilotriporpionic acid (NTP),
diaminopropanetetraacetic acid (Methyl-EDTA)
hydroxyethyliminodiacetic acid (HIDA),
ethylenediaminetetraquis (methylenesulfonic acid) (EDTPO), etc. As stated above, the sulfuric ions and the oxalic ions are precipitated and separated as insoluble salts from the plating solution and consequently the plating solution can maintain optimum plating characteristics for a long time. The diagram of a machine which can offer such effects is illustrated in FIG. 1.

The plating bath 1 performs electroless copper plating (hereinafter abbreviated as copper plating). The copper plating solution is circulated along a circulation route 2 which passes through a filter column 3 (for separating floating objects such as dust or solid barium sulfate, barium oxalate, etc.). Part of the copper plating solution is sent to a reaction bath 4 and receives copper ions, a copper ion reducing agent and a pH conditioner, which are lost in plating there to recover the optimum concentrations. FIG. 1 shows a heat exchanger 13 for heating the plating solution, a copper sulfate as copper ion sources, a supply tank 21, a pH conditioner supply tank 22, a copper ion reducing agent supply tank 23, and circulation pumps 24, 25, and 27.

In the reaction bath, the concentrations of copper ions, copper ion reducing agent, and pH conditioner to be added are necessarily higher than the concentrations of those in the plating bath so as to recover the optimum concentrations of the plating solution in the plating bath with the fed-back copper plating solution. If calcium hydroxide or barium hydroxide is used as a pH conditioner, sulfuric ions and oxalic ions to be removed are precipitated as insoluble salts first in the reaction bath. Further, it sometimes happens that the concentrations of ingredients of the solution in the reaction bath are high enough to make the solution unstable.

In such a case, to prevent the copper plating solution from decomposing, a gas containing oxygen, such as air, must be blown into the reaction bath through the gas supply pipe 5. If the solubilities of sulfuric salts and oxalic salts go lower as the liquid temperature falls, it is recommended to cool the copper plating solution in the reaction bath to increase the efficiency of precipitation.

In this case, the copper plating solution passing through a pre-cooling heat exchange 6 can be supplied to the reaction bath or the reaction bath itself can be cooled. Since it is desirable to heat the cooled copper plating solution to a desired solution temperature before feeding it back to the plating bath, the copper plating solution coming from the reaction bath is fed back to the plating bath through a heating heat exchanger 7.

A concentration analyzer 8 measures the concentration of copper ions, the concentration of the reducing agent, and the pH of the plating solution in the reaction tank. The quantities of ingredients to be supplied are controlled by pumps 9, 10, and 11 so that the measured concentrations may be predetermined concentrations. The concentrations of sulfuric ions and oxalic ions can be measured by chromatography. Part of the plating solution is taken out from the reaction bath for measurement. Besides chromatography, the measurement can be done by a capillary electrophoresis analyzer.

Figure 2:
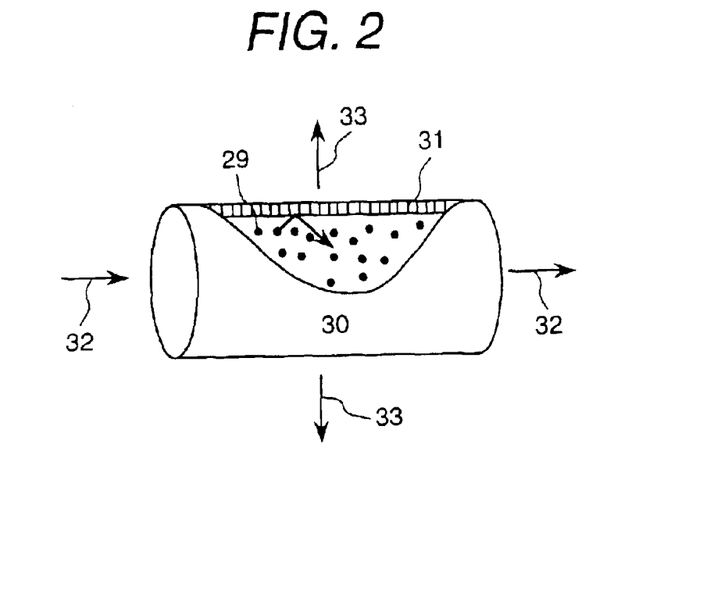
FIG. 2 is a schematic diagram of the ultra filtration unit used in the plating machine in accordance with the present invention.

The copper plating solution supplied with copper ions, copper ion reducing agent, and pH conditioner from the reaction bath is fed to a ultra filtration unit 12. The ultra filtration unit 12 contains an ultra filtration membrane which separates the inner copper plating solution coming from the reaction bath from the outer copper plating solution coming from the plating bath. This is a cross-flow type ultra filtration unit. FIG. 2 is a diagrammatic illustration of the ultra filtration unit illustrating the principle thereof FIG. 2 shows fine particles of crystals 29, a cross-flow type ultra filtration unit 12, an ultra filtration membrane 31, a flow of plating solution 32, and a filtrate 33.

Using the characteristics of the ultra filtration unit that lets ions and low molecular organic compounds penetrate the membrane, but blocks fine particles, the solid precipitate produced in the reaction bath is separated and removed out from the system. In other words, only ions passing through the ultra filtration membrane can be fed back to the plating bath and solid components can be continuously removed from the system.

In the cross-flow filtration, the copper plating solution flows along the surface of the membrane. This prevents the membrane from being blocked quickly. Only the filtrate which passes through the membrane is fed back to the plating bath. This prevents the crystallized fine particles from returning to the plating solution. The pore size of the membrane is 0.5 microns or less, preferentially 0.1 microns or less.

The filtration provided in accordance with the present invention can be any type, so long as sulfuric and oxalic salts produced in the reaction bath are not fed back to the plating bath. Preferable filtration methods are a filter pressing method, a cross-flow method, etc.

This method enables a long stable electroless copper plating (hereinafter abbreviated as copper plating) with sulfuric and oxalic ion concentrations low in the copper plating solution.

The purpose of the present invention can be realized with the use of a similar method and device even when a compound which will not produce any insoluble salt, such as potassium hydroxide, etc., is used as a pH conditioner, when calcium or barium is added singly in the reaction bath or when calcium or barium carbonate, acetate, oxide, or chloride is added to the copper plating solution.

However, when calcium carbonate and/or barium carbonate are used, carbonic ions increase in the copper plating solution. When calcium acetate and/or barium acetate are used, acetic ions increase in the copper plating solution. Similarly, when calcium chloride and/or barium chloride are used, chloric ions increase in the copper plating solution.

Therefore, for the use of a calcium salt and/or a barium salt, the quantity of the salt should be such that its salt precipitate may not exert any influence upon the plating characteristics. It is required to estimate the influence of the salt in advance.

On the contrary, calcium hydroxide, barium hydroxide, calcium, barium, calcium oxide, and barium oxide (when added to the copper plating solution) will not increase ions in the copper plating solution and are preferable since they can make the plating characteristics stable for a long time period.

Potassium hydroxide can be used as a pH conditioner even when calcium hydroxide and/or barium hydroxide are used to produce oxalic or sulfuric salt precipitate. Also, in this case, the purpose of the present invention can be realized.

In the above explanation, if the solubility of a compound (e.g. calcium hydroxide) to be added is low, a slurry of the compound is sometimes preferable to an aqueous solution of the compound. In this case, a slurry pump is usually used to feed the slurry compound to the reaction bath.

According to the present invention, byproduct ions, which increase as a non-electro plating reaction advances, can be eliminated, and consequentially, the electroless copper plating solution can have a longer working life, drastically reducing the plating cost.

DESCRIPTION OF THE PREFERRED EMBODIMENTS

Embodiment 1

A first embodiment of the present invention uses copper sulfate as copper ion sources, as a copper ion source, glyoxylic acid as a copper ion reducing agent and barium hydroxide as a pH conditioner. This embodiment uses EDTA pentasodium as a complexing agent because the solubility of barium hydroxide is not so great.

Below are listed the ingredients of the plating solution and the plating condition.

(Ingredients)

Copper (II) sulfate pentahydrate 0.04 mol per liter

EDTA pentasodium 0.1 mol per liter

Glyoxylic acid 0.03 mol per liter

Barium hydroxide 0.01 mol per liter 2,2' bipyridyl 0.0002 mol per liter

Polyethylene glycol (mean molecular weight=600) 0.03 mol per liter

The concentration of barium hydroxide is controlled to keep the pH of the plating solution at 12.3.

(Plating Condition)

pH 12.3 plating solution temperature 70° C.

A copper wiring pattern was plated on a test board in said copper plating solution. The stability of the plating solution and the quality of the plated layer were evaluated from the existence of an abnormal deposition of copper. The test board was prepared as stated below. The physical property of the plated layer was also evaluated.

(Preparation of a Test Board)

A test board was prepared by coating both surfaces of a 0.6 mm-thick glass-sheet reinforced resin laminated board with an adhesive containing acrylonitrilebutadiene rubber modified phenol resin as the main ingredient, and hardening the test board of at 160° C. for ten minutes. The hardened test board has an adhesive layer of about 30 microns thick on each surface. Then, the test board was drilled at preset locations and dipped in a coarsening liquid containing chromic anhydride and hydrochloric acid to coarsen the adhesive surfaces.

Next, the board was dipped for ten minutes in a single-liquid palladium colloidal catalyst solution (fabricated by Hitachi Kasei Co., Ltd. acid aqueous solution containing intensifier HS101B) as a copper plating catalyst, washed clean with water, and dried up at 120° C. for 20 minutes.

Both surfaces of the board were coated with a dry-film photo-resist layer 35 microns thick (SR-3000 fabricated by Hitachi Kasei Co., Ltd). A mask of a test pattern comprising lines 60 microns thick was placed on the photo resist surface of the board. The board was exposed to light and developed. As the result, the non-pattern parts on the surface of the board are all covered with the photo-resist.

The test board prepared above and a stainless steel plate were both dipped in the plating solution at a liquid temperature of 70° C. and plated with a load of 1 $dm^2$ per liter.

The stainless steel plate was prepared by dipping the plate in 17% hydrochloric aqueous solution for 2 minutes, dipping it in the above palladium collidal solution for 10 minutes, and washing it thoroughly. While plating is in progress, air was blown into the plating solution to stir up the solution. A prepared liquid (listed below) was supplied to the plating solution to make the concentration of copper ions, the concentration of glyoxylic acid (copper ion reducing agent), and the pH constant.

(1) Copper ion supplement ($CuSO_4$ $5H_2O$) 200 grams

Water Quantity required to make one liter of the solution (2) Glyoxylic acid (copper ion reducing agent) supplement 40% glyoxylic acid solution (3) pH conditioner ($Ba(OH)_2$) 40 grams Water Quantity required to make one liter of the solution One plating cycle comprises a plating step to form a 30 μm-thick copper layer on the stainless steel plate and the pattern area of the test board. At the end of each plating cycle, the plated copper layer was peeled off from the stainless steel plate, cut into a piece of 1.25 cm by 10 cm. The mechanical strength of the piece was measured by an ordinary tensile tester.

The precipitates (barium sulfate, barium oxalate, and others) which were formed during plating were filtered and removed by circulation and filtration of the plating solution. After each plating cycle is completed, the plating solution is cooled down to room temperature (25° C.) and filtered to remove the precipitates (barium sulfate, barium oxalate, and others) before the succeeding plating cycle. The concentrations of the sulfuric and oxalic ions in this clean plating solution were measured by chromatography. Table 1 shows the result of the measurement.

TABLE 1

| | Unit | Number of plating cycles | | | | | | |
|---|---|---|---|---|---|---|---|---|
| | | 1 | 2 | 3 | 4 | 5 | 6 | 7 |
| Embodiment 1 | | | | | | | | |
| Conc. of sulfuric ions | mol/l | $8 \times 10^{-3}$ | $9 \times 10^{-3}$ | $9 \times 10^{-3}$ | $8 \times 10^{-3}$ | $8 \times 10^{-3}$ | $8 \times 10^{-3}$ | $8 \times 10^{-3}$ |
| Conc. of oxalic ions | mol/l | $7 \times 10^{-6}$ | $7 \times 10^{-6}$ | $7 \times 10^{-6}$ | $6 \times 10^{-6}$ | $7 \times 10^{-6}$ | $6 \times 10^{-6}$ | $6 \times 10^{-6}$ |
| Ductility of plate film | % | 9.8 | 10.5 | 9.7 | 10.1 | 7.8 | 10.3 | 6.8 |
| Abnormal deposition | — | None | None | None | None | None | None | None |
| Embodiment 2 | | | | | | | | |
| Conc. of sulfuric ions | mol/l | $1 \times 10^{-4}$ | $1 \times 10^{-4}$ | $1 \times 10^{-4}$ | $1 \times 10^{-4}$ | $1 \times 10^{-4}$ | $1 \times 10^{-4}$ | $1 \times 10^{-4}$ |
| Conc. of oxalic ions | mol/l | $7 \times 10^{-5}$ | $7 \times 10^{-5}$ | $6 \times 10^{-5}$ | $7 \times 10^{-5}$ | $7 \times 10^{-5}$ | $6 \times 10^{-5}$ | $5 \times 10^{-5}$ |
| Ductility of plate film | % | 10.1 | 8.5 | 9.6 | 7.1 | 6.8 | 10.2 | 7.2 |
| Abnormal deposition | — | None | None | None | None | None | None | None |
| Embodiment 3 | | | | | | | | |
| Conc. of sulfuric ions | mol/l | $9 \times 10^{-3}$ | $9 \times 10^{-3}$ | $8 \times 10^{-3}$ | $8 \times 10^{-3}$ | $9 \times 10^{-3}$ | $8 \times 10^{-3}$ | $8 \times 10^{-3}$ |
| Conc. of formic ions | mol/l | 0.12 | 0.28 | 0.42 | 0.62 | 0.78 | 0.92 | 1.12 |
| Ductility of plate film | % | 10.5 | 8.8 | 7.5 | 6.8 | 5.2 | 4.6 | 3.5 |
| Abnormal deposition | — | None | None | None | None | None | Little | Little |
| Embodiment 4 | | | | | | | | |
| Conc. of sulfuric ions | mol/l | $1 \times 10^{-4}$ | $1 \times 10^{-4}$ | $1 \times 10^{-4}$ | $1 \times 10^{-4}$ | $1 \times 10^{-4}$ | $1 \times 10^{-4}$ | $1 \times 10^{-4}$ |
| Conc. of formic ions | mol/l | 0.11 | 0.26 | 0.43 | 0.62 | 0.77 | 0.95 | 1.18 |
| Ductility of plate film | % | 11.0 | 10.2 | 7.6 | 7.3 | 5.5 | 4.3 | 3.4 |
| Abnormal deposition | — | None | None | None | None | None | Little | Little |
| Embodiment 6 | | | | | | | | |
| Conc. of sulfuric ions | mol/l | $9 \times 10^{-3}$ | $9 \times 10^{-3}$ | $9 \times 10^{-3}$ | $8 \times 10^{-3}$ | $8 \times 10^{-3}$ | $8 \times 10^{-3}$ | $8 \times 10^{-3}$ |
| Conc. of oxalic ions | mol/l | $7 \times 10^{-6}$ | $7 \times 10^{-6}$ | $7 \times 10^{-6}$ | $7 \times 10^{-6}$ | $7 \times 10^{-6}$ | $7 \times 10^{-6}$ | $7 \times 10^{-6}$ |
| Ductility of plate film | % | 10.2 | 8.7 | 9.6 | 8.8 | 8.5 | 9.8 | 7.5 |
| Abnormal deposition | — | None | None | None | None | None | None | None |
| Comparative embodiment 1 | | | | | | | | |
| Conc. of sulfuric ions | mol/l | 0.08 | 0.12 | 0.19 | 0.35 | 0.55 | — | — |
| Conc. of formic ions | mol/l | 0.12 | 0.24 | 0.38 | 0.67 | 0.98 | — | — |
| Ductility of plate film | % | 9.8 | 7.5 | 5.4 | 3.2 | 1.2 | — | — |
| Abnormal deposition | — | None | Little | Some | Some | Deposition | — | — |
| Comparative embodiment 2 | | | | | | | | |
| Conc. of sulfuric ions | mol/l | 0.08 | 0.13 | 0.18 | 0.33 | 0.56 | — | — |
| Conc. of oxalic ions | mol/l | 0.12 | 0.24 | 0.37 | 0.77 | 1.02 | — | — |
| Ductility of plate film | % | 9.7 | 7.7 | 5.2 | 2.8 | 1.0 | — | — |
| Abnormal deposition | — | None | Little | Some | Some | Deposition | — | — |

The concentrations of sulfuric and oxalic ions in the plating solution were measured after the plating solution was filtered at the end of each plating cycle.

Even after seven plating cycles, the sulfuric ion concentration was $1.5 \times 10^{-4}$ mol per liter or less and the oxalic ion concentration was $7.9 \times 10^{-5}$ mol per liter or less. The ductility of the obtained plated layer was 6% or more and was not deteriorated so much as the number of plating cycles increased. Further, no abnormal deposition was visually detected on the test board, in the plating bath, pipings, and so on. The plating solution was extremely steady even after seven plating cycles were completed.

As stated above, the method in accordance with the present invention was found to suppress an increase of sulfuric and oxalic ions in the plating solution. This is due to the use of barium hydroxide as a pH conditioner which causes the sulfuric and oxalic ions to precipitate as insoluble barium salts. This precipitate is separated from the plating solution, and so the plating solution can be almost free from sulfuric and oxalic ions.

The long excellent plating characteristics can be obtained by plating under conditions of the sulfuric ion concentration of 0.1 mol per liter or less and the oxalic ion concentration of 0.2 mol per liter or less in the plating solution.

Embodiment 2

A second embodiment of the present invention was carried out under the same conditions as the first embodiment, but barium hydroxide as a pH conditioner was substituted by calcium hydroxide. As the solubility of calcium hydroxide is very low (approx. 1.7 gram solute per 1 liter water), its aqueous solution is not available. Therefore calcium hydroxide in slurry (obtained by powering calcium hydroxide and adding pure water thereto) was used.

Powdered calcium hydroxide has greater surfaces in contact with the plating solution and can easily react with sulfuric and oxalic ions into insoluble precipitates in the plating solution although the solubility of calcium hydroxide is very low. In this case, however, the efficiency of removal of sulfuric and oxalic ions from the plating solution is dependent upon the granule sizes of the calcium hydroxide powder, the rate of solution stirring, and so on. They must be optimized in advance.

To prevent a lot of crystals including un-dissolved calcium hydroxide from existing in the plating solution, this embodiment employs a method of adding a slurry of calcium hydroxide into the reaction bath, which is provided separately from the plating bath, instead of adding a slurry of calcium hydroxide directly into the plating bath, mixing the slurry and the plating solution in the plating bath, removing the precipitate by the ultra filtration unit, and feeding back the filtered plating solution to the plating bath.

Table 1 shows the result of an evaluation of the plating characteristics. This method can keep the sulfuric and oxalic concentrations very low (0.01 mol per liter or less of sulfuric ion and $7 \times 10^{-6}$ mol per liter or less of oxalic ion) even after seven plating cycles.

The ductility of the obtained copper layer (foil) was 6% or more and remained almost unchanged even after many plating cycles. Further, no abnormal deposition was visually detected on the test board, in the plating bath, pipings, and so on. The plating solution was extremely steady even after seven plating cycles were completed.

Embodiment 3

A third embodiment of the present invention uses copper sulfate as copper ion sources, as a copper ion source, formaldehyde as a copper ion reducing agent and barium hydroxide as a pH conditioner. In this case, the oxidant ion of the formaldehyde is formic acid. This embodiment assumes that formic acid cannot be removed as a precipitate. Below are listed the ingredients of the plating solution and the plating condition.

(Ingredients)
Copper (II) sulfate pentahydrate 0.04 mol per liter
EDTA pentasodium 0.1 mol per liter
Formaldehyde 0.03 mol per liter
Barium hydroxide 0.01 mol per liter
2,2' bipyridyl 0.0002 mol per liter
Polyethylene glycol
(mean molecular weight=600) 0.03 mol per liter The concentration of barium hydroxide is controlled to keep the pH of the plating solution at 12.3.
(Plating Condition)
pH 12.3
Liquid temperature 70° C.

This embodiment plated the same test board using the same method as Embodiment 1 in the above copper plating solution. The physical property of the obtained plated layer (foil), abnormal deposition, and concentrations of salts in the plating solution were tested and measured in the same manner as Embodiment 1. 37% formaldehyde aqueous solution is used to supply the copper ion reducing agent.

Table 1 shows the result of an evaluation of the plating characteristics. The concentration of sulfuric ions in the plating solution was measured after the plating solution was filtered at the end of each plating cycle. This method can keep the sulfuric concentration very low ($1.5 \times 10^{-4}$ mol per liter or less) even after seven plating cycles.

The ductility of the plated layer (foil) formed in the seventh plating cycle was under half as much as that of the plated layer (foil) formed in the first plating cycle, but it was strong enough to assure the reliability. Further, within five plating cycles, no abnormal deposition was visually detected on the test board, in the plating bath, pipings, and so on. The plating solution was extremely steady. After the sixth and seventh plating cycles, a little abnormal deposition was found on the test board and in the plating bath, but it was not significant enough to cause short-circuiting of a wiring pattern on the test board.

Embodiment 4

A fourth embodiment of the present invention was carried out under the same conditions as the third embodiment, but the pH conditioner for the plating solution and the supplement was calcium hydroxide. As the solubility of calcium hydroxide is very low, its aqueous solution is not available. Therefore calcium hydroxide (in slurry) was used as in the second embodiment.

The result of measurement is listed in Table 1. This method can keep the sulfuric concentration very low (0.01 mol per liter or less) after the seven plating cycles. The ductility of the plated layer (foil) formed in the seventh plating cycle was under half as much as that of the plated layer (foil) formed in the first plating cycle, but it was strong enough to assure the required reliability.

Further, within five plating cycles, no abnormal deposition was visually detected on the test board, in the plating bath, pipings, and so on. The plating solution was extremely steady. After the sixth and seventh plating cycles, a little abnormal deposition was found on the test board and in the plating bath, but it was not significant enough to cause short-circuiting of a wiring pattern on the test board.

Embodiment 5

A copper plating solution of a fifth embodiment of the present invention was prepared using copper sulfate as copper ion sources, as a copper ion source, glyoxylic acid as a copper ion reducing agent and potassium hydroxide as a pH conditioner in preparation of a plating solution.

(Ingredients)
Copper (II) sulfate pentahydrate 0.04 mol per liter
EDTA pentasodium 0.1 mol per liter
Glyoxylic acid 0.03 mol per liter
Potassium hydroxide 0.03 mol per liter
2,2' bipyridyl 0.0002 mol per liter
Polyethylene glycol
(mean molecular weight=600) 0.03 mol per liter The concentration of potassium hydroxide is controlled to keep the pH of the plating solution at 12.3.
(Plating Condition)
pH 12.3
Liquid temperature 70° C.

A prepared liquid (listed below) was supplied to the plating solution to make the concentration of copper ions, the concentration of glyoxylic acid (a copper ion reducing agent), and the pH constant, although they decrease as the plating advances.

(1) Copper ion supplement ($CuSO_4 \cdot 5H_2O$) 200 grams
Water Quantity required to make one liter of the solution
(2) Glyoxylic acid (copper ion reducing agent) supplement 40% glyoxylic acid solution
(3) pH conditioner ($Ba(OH)_2$) 40 grams
Water Quantity required to make one liter of the solution As seen from the above, an aqueous solution of barium hydroxide is used to keep the pH of the plating solution constant, although potassium hydroxide is used as a pH conditioner when the plating solution is prepared.

Even after seven plating cycles, the sulfuric ion concentration was $1.5 \times 10^{-4}$ mol per liter or less and the oxalic ion concentration was $7.9 \times 10^{-5}$ mol per liter or less. The ductility of the obtained plated layer was 6% or more and was not deteriorated so much as the number of plating cycles increased. Further, no abnormal deposition was visually detected on the test board, in the plating bath, pipings, and so on. The plating solution was extremely steady even after seven plating cycles were completed.

Embodiment 6

A sixth embodiment of the present invention uses a plating solution containing copper sulfate as copper ion sources, as a copper ion source, glyoxylic acid as a copper ion reducing agent and potassium hydroxide as a pH conditioner. Below are listed the ingredients of the plating solution and the plating condition.

(Ingredients)

Copper (II) sulfate pentahydrate 0.04 mol per liter

EDTA pentasodium 0.1 mol per liter

Glyoxylic acid 0.03 mol per liter

Potassium hydroxide 0.03 mol per liter 2,2' bipyridyl 0.0002 mol per liter

Polyethylene glycol (mean molecular weight=600) 0.03 mol per liter

The concentration of potassium hydroxide is controlled to keep the pH of the plating solution at 12.3.

(Plating Condition)

pH 12.3

Liquid temperature 70° C.

This embodiment carried out plating according to the processing flow illustrated in FIG. 1 using the above plating solution. In other words, the copper plating was carried out in the plating bath 1. The plating solution is circulated through a filtration column 3 along the circulation path 2.

Part of the copper plating solution is sent to a reaction bath 4 and receives copper ions, a copper ion reducing agent, and a pH conditioner to supplement the lost quantities of ingredients. The composition of the supplemental solution is listed below.

(1) Copper ion supplement ($CuSO_4$ $5H_2O$) 200 grams

Water Quantity required to make one liter of the solution (2) Glyoxylic acid (copper ion reducing agent) supplement 40% glyoxylic acid solution (3) pH conditioner (KOH) 200 grams Water Quantity required to make one liter of the solution Calcium powder was added to the plating solution in the reaction bath to react with sulfuric and oxalic ions into insoluble salts. As the pH of the plating solution increases when the calcium powder is added, the pH conditioner is added to the plating solution to decrease the pH. Further, the calcium powder generates heat of dissolution when it dissolves into the plating solution. Thus, care must be taken when dissolving the powder.

Therefore, the reaction bath was cooled for efficient separation of the precipitate of oxalic salt.

When the calcium powder is added, the plating solution has lots of precipitates (calcium sulfate, calcium oxalate, and calcium particles which remain un-dissolved). Embodiment 6 removed these precipitates from the plating solution by means of the ultra filtration unit, regulated the concentration of copper ions, the concentration of glyoxylic acid and the pH to predetermined values, and then fed back the plating solution to the plating bath 1.

Table 1 shows the result of an evaluation of the plating characteristics (the concentration of sulfuric ions, the concentration of oxalic ions, the ductility of the plated layer, and detection of abnormal deposition) of each plating cycle.

The concentration of sulfuric ions and the concentration of oxalic ions in the table are the result of measurement after each plating cycle is completed. This embodiment can keep the sulfuric and oxalic concentrations very low (0.01 mol per liter or less of sulfuric ion and $7 \times 10^{-5}$ mol per liter or less of oxalic ion) even after seven plating cycles.

The ductility of the obtained copper layer (foil) was 6% or more and remained almost unchanged even after many plating cycles. Further, no abnormal deposition was visually detected on the test board, in the plating bath, pipings, and so on. The plating solution was extremely steady even after seven plating cycles were completed.

Embodiment 7

A seventh embodiment of the present invention was carried out under the same conditions as Embodiment 6, but calcium powder was replaced by barium oxide to react with sulfuric and oxalic ions into precipitates. The testing method of this embodiment is the same as Embodiment 6.

This embodiment can keep the sulfuric and oxalic concentrations very low ($1.5 \times 10^{-4}$ mol per liter or less of sulfuric ion and $7.9 \times 10^{-5}$ mol per liter or less of oxalic ion) even after seven plating cycles. The ductility of the obtained copper layer (foil) was 6% or more and remained almost unchanged even after many plating cycles. Further, no abnormal deposition was visually detected on the test board, in the plating bath, pipings, and so on. The plating solution was extremely steady even after seven plating cycles were completed.

Embodiment 8

An eighth embodiment of the present invention was carried out under the same conditions as Embodiment 6, but calcium powder was replaced by barium carbonate to react with sulfuric and oxalic ions into precipitates. The testing method of this embodiment is the same as Embodiment 6.

This embodiment can keep the sulfuric and oxalic concentrations very low ($1.5 \times 10^{-4}$ mol per liter or less of sulfuric ion and 7.9? 10-5 mol per liter or less of oxalic ion) even after seven plating cycles. The ductility of the obtained copper layer (foil) was 6% or more and remained almost unchanged even after many plating cycles.

However, it was found that the plating rate was reduced as the carbonate increased in the plating solution. As a result of visual checks, the plating solution was extremely steady even after seven plating cycles were completed, but a little abnormal deposition was found on the test board.

As stated above, the most excellent barium compound to be added to the plating solution to react with sulfuric and oxalic ions into precipitates is barium oxide, barium hydroxide, or a simple substance of barium, since they will not increase ions in the plating solution.

Although barium carbonate added to the plating solution as in this embodiment can suppress an increase of sulfuric and oxalic ions in the plating solution, an increase of carbonate ions was recognized. However, the plating characteristic of this embodiment is better than that of a method which does not use this embodiment. By plating with a concentration of sulfuric ions of 0.1 mol per liter and a concentration of oxalic ions of 0.2 mol per liter in the plating solution, an excellent plating characteristic can be maintained for a long time. This is the effect of this embodiment.

Embodiment 9

A ninth embodiment of the present invention was carried out under the same conditions as Embodiment 6, but calcium powder was replaced by barium acetate to react with sulfuric and oxalic ions into precipitates. The testing method of this embodiment is the same as Embodiment 6.

This embodiment can keep the sulfuric and oxalic concentrations very low ($1.5 \times 10^{-4}$ mol per liter or less of sulfuric ion and $7.9 \times 10^{-5}$ mol per liter or less of oxalic ion) even after seven plating cycles. The ductility of the obtained copper layer (foil) was 3% or more and a little inferior to that of the embodiment using barium hydroxide. As a result of visual checks, the plating solution was extremely steady even after seven plating cycles were completed, but a little abnormal deposition was found on the test board. It is assumed that this is caused by the increase of acetic ions in the plating solution.

Although barium acetate added to the plating solution as in this embodiment can suppress an increase of sulfuric and oxalic ions in the plating solution, an increase of acetate ions was recognized. However, the plating characteristic of this embodiment is better than that of a method which does not use this embodiment. By plating with a concentration of sulfuric ions of 0.1 mol per liter and a concentration of oxalic ions of 0.2 mol per liter in the plating solution, an excellent plating characteristic can be maintained for a long time.

Embodiment 10

A tenth embodiment of the present invention was carried out under the same conditions as Embodiment 6, but calcium powder was replaced by barium chloride to react with sulfuric and oxalic ions into precipitates. The testing method of this embodiment is the same as Embodiment 6.

This embodiment can keep the sulfuric and oxalic concentrations very low ($1.5 \times 10^{-4}$ mol per liter or less of sulfuric ion and $7.9 \times 10^{-5}$ mol per liter or less of oxalic ion) even after seven plating cycles. The ductility of the obtained copper layer (foil) was 3% or more and a little inferior to that of the embodiment using barium hydroxide. As a result of visual checks, the plating solution was extremely steady even after seven plating cycles were completed, but a little abnormal deposition was found on the test board. It is assumed that this is caused by the increase of chloric ions in the plating solution.

As stated above, the most excellent barium compound to be added to the plating solution to react with sulfuric and oxalic ions into precipitates is barium hydroxide, barium oxide, or a simple substance of barium, since they will not increase ions in the plating solution.

Although barium chloride added to the plating solution as in this embodiment can suppress an increase of sulfuric and oxalic ions in the plating solution, an increase of chloride ions was recognized. However, the plating characteristic of this embodiment is better than that of a method which does not use this embodiment. By plating with a concentration of sulfuric ions of 0.1 mol per liter and a concentration of oxalic ions of 0.2 mol per liter in the plating solution, an excellent plating characteristic can be maintained for a long time. This is the effect of this embodiment.

Embodiment 11

This embodiment of the present invention was carried out under the same conditions as Embodiment 6, but calcium to be added to the plating solution was replaced by barium to react with sulfuric and oxalic ions into precipitates.

This embodiment can keep the sulfuric and oxalic concentrations very low ($1.5 \times 10^{-4}$ mol per liter or less of sulfuric ion and $7.9 \times 10^{-5}$ mol per liter or less of oxalic ion) even after seven plating cycles. The ductility of the obtained copper layer (foil) was 6% or more and remained almost unchanged even after many plating cycles. Further, no abnormal deposition was visually detected on the test board, in the plating bath, pipings, and so on. The plating solution was extremely steady even after seven plating cycles were completed.

Embodiment 12

A twelfth embodiment of the present invention uses copper sulfate as copper ion sources, as a copper ion source, formaldehyde as a copper ion reducing agent and potassium hydroxide as a pH conditioner. In this case, the oxidant ion of the formaldehyde is formic acid. This embodiment assumes that formic acid cannot be removed as a precipitate. Below are listed the ingredients of the plating solution and the plating condition.

(Ingredients)

Copper (II) sulfate pentahydrate 0.04 mol per liter

EDTA pentasodium 0.1 mol per liter

Formaldehyde 0.03 mol per liter

Potassium hydroxide 0.03 mol per liter 2,2' bipyridyl 0.0002 mol per liter

Polyethylene glycol (mean molecular weight=600) 0.03 mol per liter

The concentration of potassium hydroxide is controlled to keep the pH of the plating solution at 12.3.

(Plating Condition)

pH 12.3

Liquid temperature 70° C.

This embodiment plated the same test board using the same method as Embodiment 1 in the above copper plating solution in the plating flow illustrated in FIG. 1.

The copper plating solution is circulated along a circulation route 2 which passes through a filter column 3.

Part of the copper plating solution is sent to a reaction bath 4 and receives copper ions, a copper ion reducing agent, and a pH conditioner, which are lost in plating there, to recover the optimum concentrations. The composition of the supplemental solution is listed below.

(1) Copper ion supplement ($CuSO_4$ $5H_2O$) 200 grams

Water Quantity required to make one liter of the solution (2) Formaldehyde (copper ion reducing agent) supplement 37% glyoxylic acid solution.

(3) pH conditioner (KOH) 200 grams

Water Quantity required to make one liter of the solution.

Calcium powder was added to the plating solution in the reaction bath to react with sulfuric ions into insoluble salt. As the pH of the plating solution increases when the calcium powder is added, the pH conditioner was added to the plating solution to decrease the pH. Further, the calcium powder generates a lot of heat of dissolution when it dissolves into the plating solution. Thus, care must be taken when dissolving the powder. Therefore, the reaction bath was cooled for efficient separation of the precipitate of oxalic salt.

When the calcium powder is added, the plating solution has lots of precipitates (calcium sulfate and calcium particles which remain un-dissolved). This embodiment removed these precipitates from the plating solution by means of the ultra filtration unit, regulated the concentration of copper ions, the concentration of formaldehyde and the pH to predetermined values, and then fed back the plating solution to the plating bath 1.

This embodiment can keep the sulfuric concentration very low ($1.5 \times 10^{-4}$ mol per liter or less) even after seven plating cycles. The ductility of the plated layer (foil) formed in the seventh plating cycle was 3% which is under half as much as that of the plated layer (foil) formed in the first plating cycle, but it was strong enough to assure the reliability.

Further, within five plating cycles, no abnormal deposition was visually detected on the test board, in the plating bath, pipings, and so on. The plating solution was extremely steady. After the sixth and seventh plating cycles, a little abnormal deposition was found on the test board and in the plating bath, but it was not significant enough to cause short-circuiting of a wiring pattern on the test board.

Comparative Embodiment 1

This embodiment performed copper plating using a conventional copper plating solution which contained formaldehyde as a copper ion reducing agent and sodium hydroxide as a pH conditioner.

The pH and the temperature of the plating solution were respectively 12.5 and 70° C. In this case, the oxidant ion of the formaldehyde is formic acid and the solubility of sodium formate is extremely high (99.6 grams solute per 100 grams water at 25° C.). Further, the solubility of sodium sulfate is also high (21.9 grams solute per 100 grams water at 25° C.). Therefore, sodium formate and sodium sulfate will never precipitate even after the copper plating solution is cooled, and so these ions (byproduct ions) cannot be removed.

The concentration of sulfuric ions, the concentration of formic ions, and the physical quantity of the plated layer (foil) in repetitive plating are illustrated in Table 1.

Table 1 shows that, as the repetitive plating advances, the sulfuric and formic ions increase in the plating solution and the ductility of the plated layer (foil) decreases. Further, the copper plating solution became unstable as the plating advanced. The plating solution started autolysis halfway in the fifth plating and was unable to plate.

Comparative Embodiment 2

This embodiment performed copper plating using the same copper plating solution as Comparative Embodiment 2 but calcium hydroxide as the pH conditioner was replaced by potassium hydroxide. The pH and the temperature of the plating solution were respectively 12.5 and 70° C.

In this case, the solubility of potassium sulfate is high (10.8 grams solute per 100 grams water at 25° C.). Therefore, sodium sulfate will never precipitate, and so the sulfuric ions cannot be removed.

Similarly, the solubility of potassium oxalate is also high (35.9 grams solute per 100 grams water at 25° C.). Therefore, potassium oxalate did not precipitate even after the copper plating solution was cooled, and so the oxalic ions could not be removed.

The concentration of sulfuric ions, the concentration of oxalic ions, and the physical quantity of the plated layer (foil) in repetitive plating are illustrated in Table 1.

Table 1 shows that, as the repetitive plating advances, the amount of sulfuric and oxalic ions increases in the plating solution and the ductility of the plated layer (foil) decreases. Further, the copper plating solution became unstable as the plating advanced. The plating solution started autolysis halfway in the fifth plating and was unable to plate.

As seen from the above, it is apparatus that use methods which are not in accordance with the present invention that cause blocking ions to increase in the plating solution, with the result that the plating characteristics are deteriorated. This has proven that the present invention has an advantage.

Embodiment 13

Figure 3:
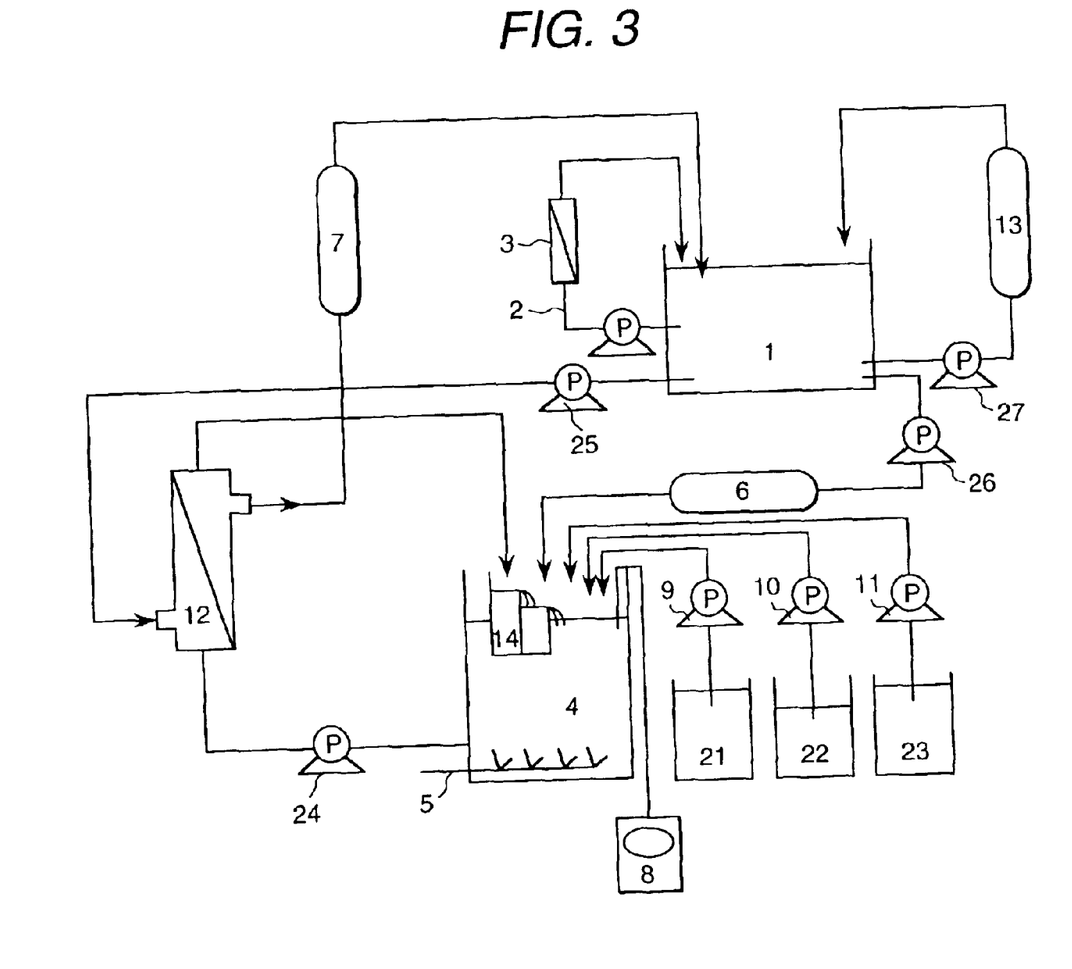
FIG. 3 is a diagram illustrating the configuration of a plating machine according to a preferred embodiment of the present invention.

Below will be explained a plating machine which is one embodiment in accordance with the present invention. FIG. 3 is a diagram showing the configuration of a plating machine in accordance with the present invention.

The copper plating was carried out in the plating bath 1. The copper plating solution is circulated through a filtration column 3 along a circulation path 2 to remove solids floating in the copper plating solution. The device has another circulation path passing through a heat exchanger 13 to heat up the copper plating solution to a predetermined temperature.

Part of the copper plating solution is sent to a reaction bath 4 and receives copper ions, a copper ion reducing agent, and a pH conditioner to supplement the lost quantities of ingredients.

In the reaction bath 4, the concentrations of copper ions, copper ion reducing agent, and pH conditioner to be added are necessarily higher than the concentrations of those in the plating bath to recover the optimum concentrations of the plating solution in the plating bath 1 with the fed-back copper plating solution.

To prevent the copper plating solution from decomposing in the reaction bath 4, a gas containing oxygen, such as air, is blown into the copper plating solution in the reaction bath through a gas supply valve 5 to stir up the solution with the gas. A concentration analyzer 8 measures the concentration of copper ions, the concentration of the reducing agent, and the pH of the plating solution in the reaction tank. The quantities of ingredients to be supplied are controlled by pumps 9, 10, and 11 so that the measured concentrations may be predetermined concentrations.

Pumps 9, 10, and 11 respectively supply copper sulfate as copper ion sources, aqueous solution, glyoxylic acid aqueous solution, and barium hydroxide aqueous solution in that order.

The concentrations of copper ions, the copper ion reducing agent, and the pH conditioner of the copper plating solution in the reaction bath are higher than those of the plating solution in the plating bath. Barium sulfate and barium oxalate are saturated and precipitated first in the reaction bath 4 as the copper plating solution is cooled by the heat exchanger 6 before entering the reaction bath 4.

These precipitates (fine crystallized particles) are separated from the copper plating solution by the cross-flow type ultra filtration unit 12. The filtered clean copper plating solution is fed back to the plating bath through the heating heat exchanger 7.

The copper plating solution containing a lot of precipitate is sent to the settling bath 14 in the upstream side of the reaction bath 4. Only the supernatant plating solution overflows a weir which is provided between the settling bath 14 and the reaction bath 4 back into the reaction bath 4.

70% or more of the solid precipitate in the copper plating solution sent to the settling bath 14 remains settled and is taken out of the system.

As stated above, the device in accordance with the present invention can remove sulfuric and oxalic ions which deteriorate the plating characteristics as barium salts and maintain an excellent plating characteristic for a long time.

Embodiment 14

Figure 4:
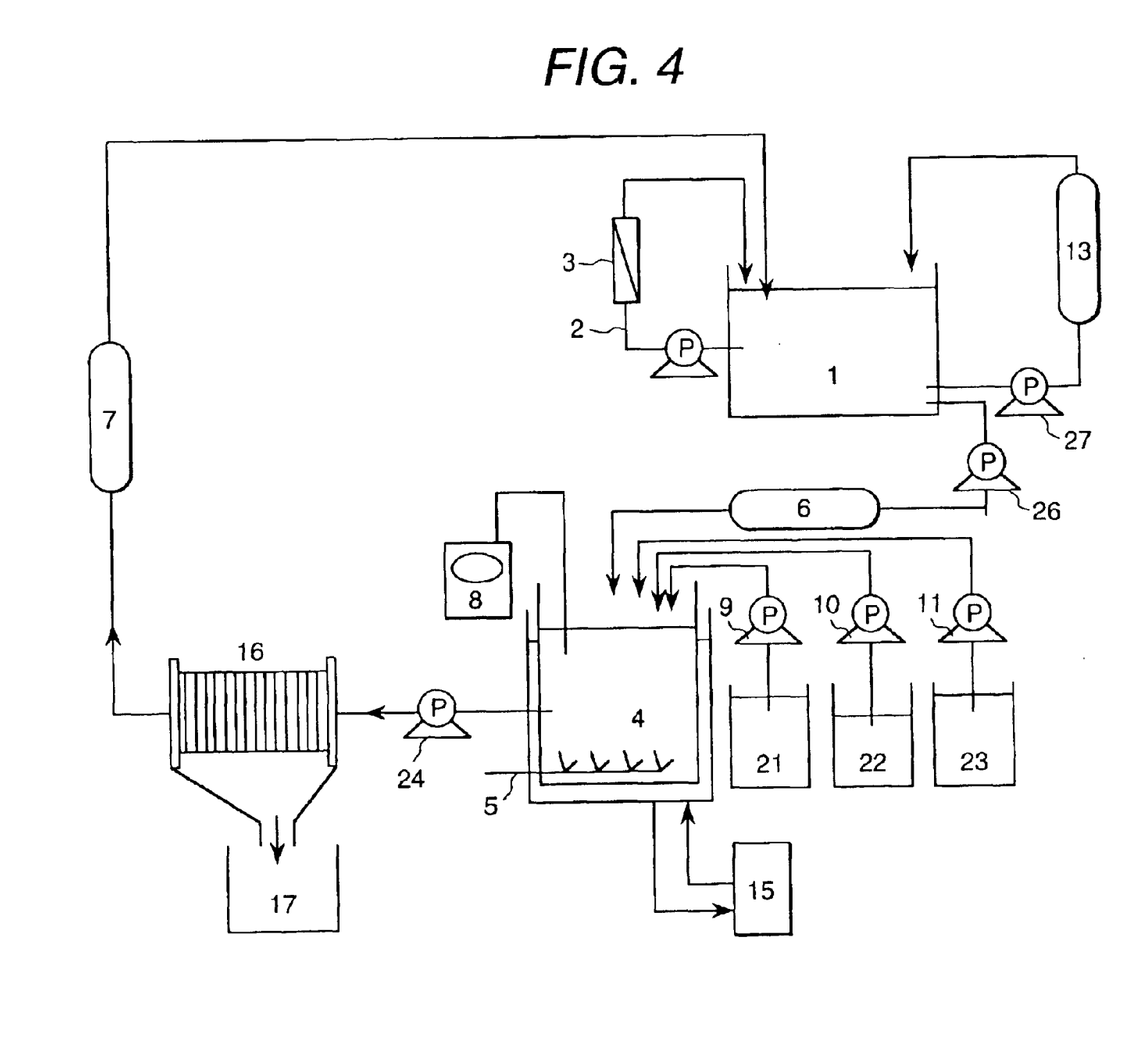
FIG. 4 is a diagram illustrating the configuration of a plating machine according to another preferred embodiment of the present invention.

FIG. 4 is a flow diagram of a plating machine using a filter press type ultra filtration unit. This embodiment uses almost the same units as those of Embodiment 13 and performs similar operations. An explanation thereof is omitted here, Unit 17 is a recovery tank.

This embodiment is characterized in that the whole reaction bath 4 is cooled further by water sent from the cooling unit 15 after part of the copper plating solution is supplied to the reaction bath 4.

The concentrations of copper ions, the copper ion reducing agent, and the pH conditioner of the copper plating solution in the reaction bath 4 are higher than those of the plating solution in the plating bath 1, and the reaction bath 4 is cooled by water from the cooling unit 15. Therefore, barium sulfate and barium oxalate are first saturated and easily precipitated in the reaction bath.

These precipitates (fine crystallized particles) are separated from the copper plating solution by the filter press type ultra filtration unit 16. The filtered clean copper plating solution is fed back to the plating bath 1 through the heating heat exchanger 7.

The precipitate caught by the filter press type ultra filtration unit 16 is scaled off from the filter membrane into the recovery tank 17 through a funnel-shaped collecting means, and taken out from the system.

As stated above, the device in accordance with the present invention can remove sulfuric and oxalic ions which deteriorate the plating characteristics as barium salts and maintain an excellent plating characteristic for a long time.

Embodiment 15

Figure 5:
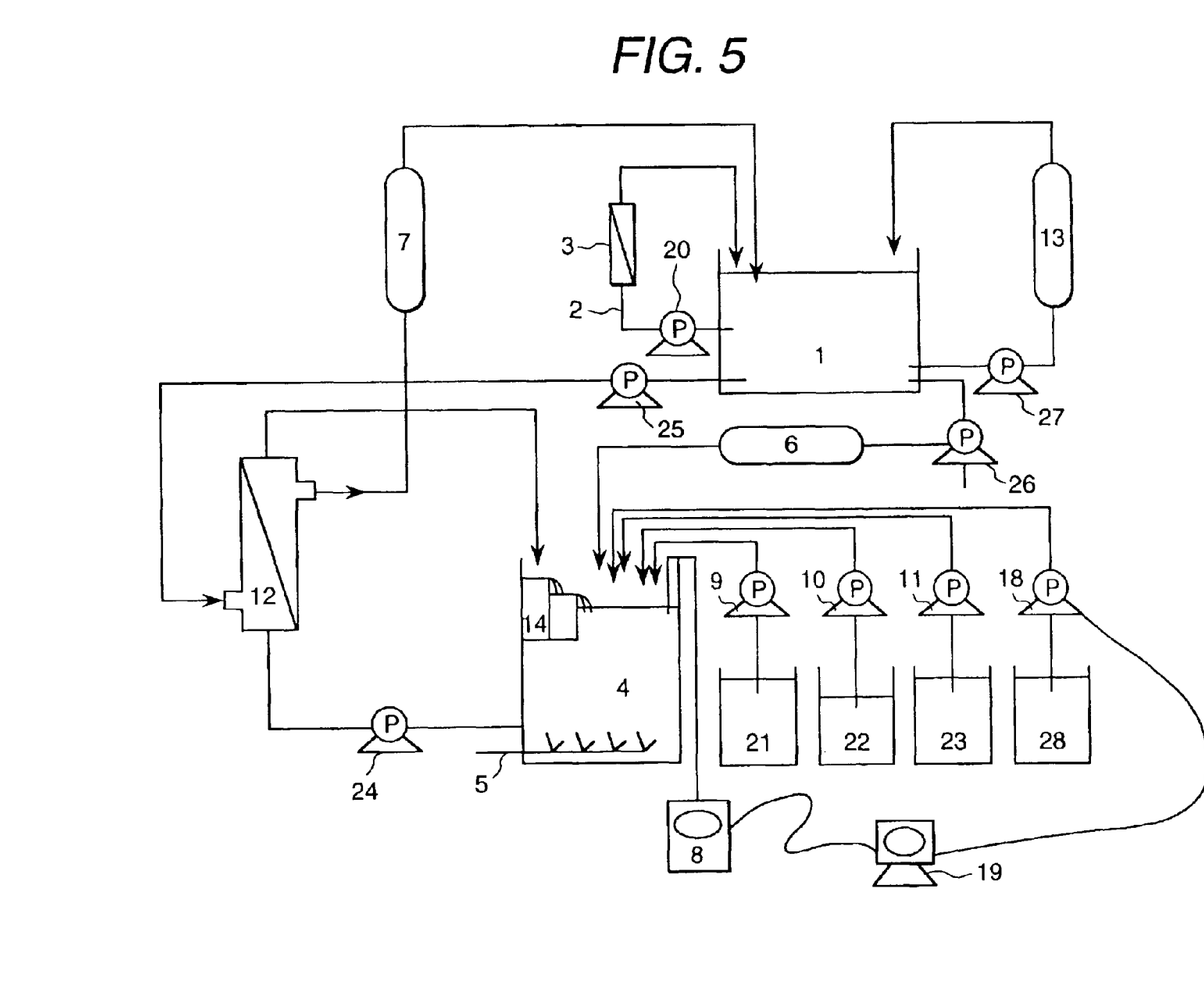
FIG. 5 is a diagram illustrating the configuration of a plating machine according to another preferred embodiment of the present invention.

This embodiment uses a copper plating solution containing barium hydroxide or calcium hydroxide as a pH conditioner. FIG. 5 is a flow diagram of a plating machine using alkaline metal hydroxide such as sodium hydroxide or potassium hydroxide as a pH conditioner. FIG. 5 contains a delivery pump 26 and an alkali earth metal salt supply tank 28.

The reaction bath 4 is equipped with a supply pump 18 for supplying aqueous solution containing at least one of calcium hydroxide, barium hydroxide, calcium carbonate, barium carbonate, calcium acetate, barium acetate, calcium oxide, barium oxide, calcium, and barium to react with sulfuric and oxalic ions into precipitates.

The quantities of chemicals to precipitate the ions are regulated by a pump 9 for supplying copper sulfate as copper ion sources, aqueous solution, a pump 10 for supplying glyoxylic acid aqueous solution, and an analyzing unit 8.

The quantity of sulfuric ions in the copper plating solution can be calculated from the quantity of copper sulfate as copper ion sources, solution supplied by pump 9. The quantity of oxalic ions in the copper plating solution is calculated as the difference between the quantity of oxalic acid solution measured by the analyzing unit 8 and the quantity of the existing glyoxylic acid. The copper plating solution control unit 19 performs these calculations and controls the pump 18 according to the result of calculation. The other configuration of this embodiment is the same as that of Embodiment 13 and Embodiment 14.

As stated above, the device in accordance with the present invention can remove sulfuric and oxalic ions which deteriorate the plating characteristics as barium salts and maintain an excellent plating characteristic for a long time.

Embodiment 16

Figure 6:
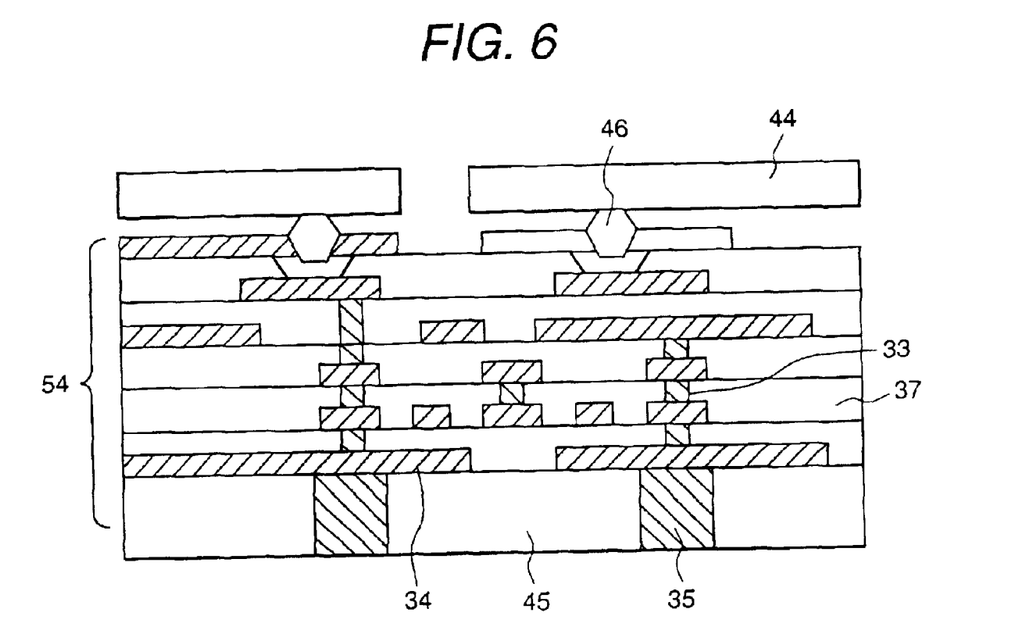
FIG. 6 is a schematic sectional diagram of a module having semiconductor elements on a multi-layer board plated in accordance with the present invention.

FIG. 6 is a diagrammatic sectional view of a module comprising a multi-layer wiring board 54 produced by a copper plating method in accordance with the present invention and semiconductor elements thereon. A number 45 indicates an insulating layer.

The multi-layer wiring board 54 is prepared by forming a wiring pattern on each board with a known photo-resist, plating a conductor wiring 34 on the board by a method stated in said embodiments, and piling a preset number of said plated boards with an insulating layer 37 therebetween.

The conductor wirings on the plated boards are electrically connected by via-holes 36 and through-holes 35 which are drilled in advance and plated by a copper plating method of the present invention.

Semiconductor elements 46 are mounted on predetermined locations of said multi-layer wiring board 54 by a method using solder balls 44. With this, a highly reliable module can be obtained.

What is claimed is:

1. An electroless copper plating machine using a plating solution containing copper sulfate as copper ion sources, and a copper ion complex agent, glyoxylic acid or salt thereof as a copper ion reducing agent, and a pH conditioner, wherein said machine comprises an electroless copper plating bath for containing an electroless copper plating solution, a reaction bath which adds at least one of alkaline earth metal, alkaline earth metal hydroxide, alkaline earth metal oxide, and alkaline earth metal salt (excluding sulfuric salt) to said copper plating solution therein to react with and precipitate sulfuric ions and oxalic ion as alkaline earth metal salt precipitate in said plating solution, and a filter unit for separating said metal salt precipitate.

2. An electroless copper plating machine using a plating solution containing copper sulfate as copper ion sources, and copper ion complex agent, a copper ion reducing agent, and a pH conditioner, wherein said machine comprises an electroless copper plating bath for containing a copper plating solution, a reaction bath which adds at least one of alkaline earth metal, alkaline earth metal hydroxide, alkaline earth metal oxide, and alkaline earth metal salt (excluding sulfuric salt) to said copper plating solution therein to react with and precipitate sulfuric ions as an alkaline earth metal salt precipitate in said plating solution, a filter unit for separating said metal salt precipitate, means for measuring the concentration of sulfuric ion in said plating solution, and means for comparing said measured concentration by a preset reference concentration and controlling the quantity of said alkaline earth metal, alkaline earth metal hydroxide, alkaline earth metal oxide, or alkaline earth metal salt (excluding sulfuric salt) to be added.

3. An electroless copper plating machine using a plating solution containing copper sulfate as copper ion sources, and a copper ion complex agent, glyoxylic acid or salt thereof as a copper ion reducing agent, and a pH conditioner, wherein said machine comprises an electroless copper plating bath for containing a copper plating solution, a reaction bath which adds at least one of alkaline earth metal, alkaline earth metal hydroxide, alkaline earth metal oxide, and alkaline earth metal salt (excluding sulfuric salt) to said copper plating solution therein to react with and precipitate sulfuric ion as an alkaline earth metal salt precipitate in said plating solution, a filter unit for separating said alkaline earth metal salt precipitate, means for measuring at least one of the sulfuric ion concentration and the oxalic ion concentration and means for comparing at least one of said measured sulfuric and oxalic concentrations by a preset reference concentration and controlling the quantity of said alkaline earth metal, alkaline earth metal hydroxide, alkaline earth metal oxide, or alkaline earth metal salt (excluding sulfuric salt) to be added.

4. An electroless copper plating machine in accordance with any one of claim 1 through claim 3, wherein said filter unit is a cross-flow ultra filtration unit or a filter press ultra filtration unit.

* * * * *